NEGATIVE RESISTANCE SEMICONDUCTOR DEVICE

Filed Feb. 8, 1968

INVENTORS
CHARLES O. MULFORD JR.
PETER J.C. NORMINGTON
ATTORNEY

D.C. DATA ON 575 CURVE TRACER

INVENTORS
CHARLES O. MULFORD JR.
PETER J.C. NORMINGTON

ATTORNEY

INVENTORS
CHARLES O. MULFORD JR.
PETER J.C. NORMINGTON

ATTORNEY

United States Patent Office 3,461,323
Patented Aug. 12, 1969

3,461,323

NEGATIVE RESISTANCE SEMICONDUCTOR DEVICE

Charles O. Mulford, Jr., Union, N.J., and Peter J. C. Normington, New Milford, Conn., assignors to The Bendix Corporation, a corporation of Delaware Filed Feb. 8, 1968, Ser. No. 704,093
Int. Cl. H03k *19/08*
U.S. Cl. 307—302 6 Claims

ABSTRACT OF THE DISCLOSURE

An elongated semiconductor device in which contacts are placed across the junction at both ends and a plasma effected by exciting the holes and electrons present in the P and N material to energize the electrons of the bonding atoms of the crystal to the conduction band.

BACKGROUND OF THE INVENTION

Field of the invention

The invention relates to the class of semiconductors which exhibit oscillation characteristics such as the tunnel diode, unijunction transistor and the Gunn diode.

Description of the prior art

Various negative resistance semiconductor devices, tunnel diodes and unijunction devices have been utilized in the past. However, they lack control of the bias point of the negative resistance. In the present invention control of the quiescent point is obtained by varying the input drive.

SUMMARY

An elongated semiconductor device in which contacts are placed across the junction at both ends. Due to the difference in mobility and mass of holes and electrons a plasma can be effected by exciting the holes and electrons initially present in the P and N material to energies sufficiently high as to raise the electrons of the bonding atoms of the crystal to the conduction band. The device may be biased with the input current so as to optimize the negative resistance region. This is a feature not possible with present devices such as the tunnel diode.

BRIEF DESCRIPTION OF THE DRAWINGS

FIGURES 1 and 8 illustrate data taken on a curve tracer.

DESCRIPTION OF PREFERRED EMBODIMENT

Figure 1:
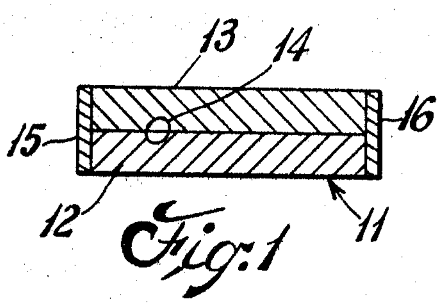
FIGURE 1 is a sectional view of a device embodying the invention.

Referring now to FIGURE 1 of the drawing, a semiconductor device is indicated generally by the numeral 11 and has a layer 12 of N type material and another layer 13 of P type material. The layers 12 and 13 form a PN junction 14 and may for example be silicon. Ohmic contacts 15 and 16 are provided across the ends of the layers 12 and 13 respectively. For purposes of illustration, the contact 15 is called the emitter contact and the contact 16, the base contact.

Figure 2:
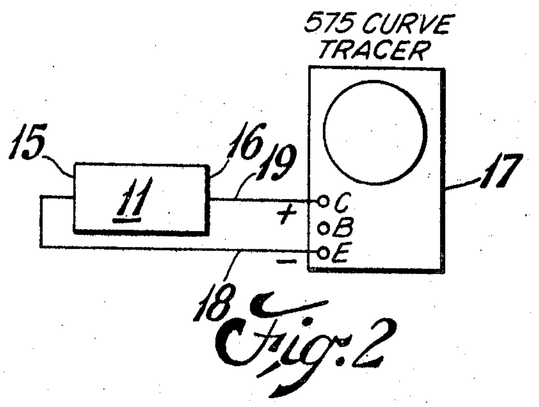
FIGURE 2 is a test circuit used to illustrate the invention.
Figure 3:
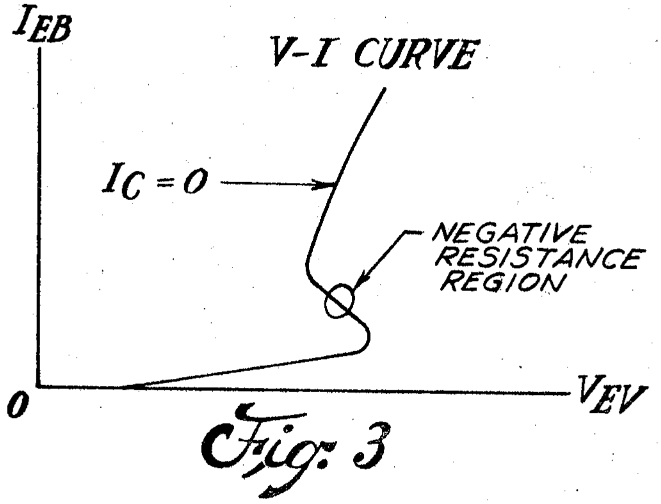
FIGURE 3 is a curve illustrating the invention.

In a specific example a device 11 of silicon having a length of 200 mils, a width of 50 mils and a thickness of 2 mils was prepared by applying an epitaxially layer of P type material 13 and a layer of N type material 12 with the restivity of the material being in the order of 7 ohms cm. The device 11 was connected to a type 575 curve tracer 17 (see FIGURE 2) by conductors 18 and 19. A suitable source of DC was connected across the device 11 by conductors 18 and 19. The curve of FIGURE 3 illustrates the negative resistance characteristics of the device and the curves 7A and 7B are pictures taken from the screen of the curve tracer which illustrates the behavior of the device.

Figures 4, 5:
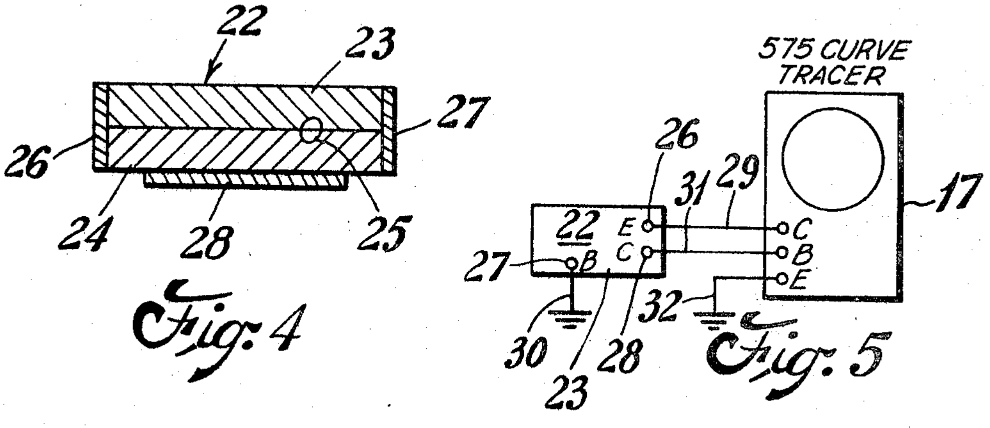
FIGURE 4 is a sectional view of a device illustrating another embodiment of the invention.
FIGURE 5 is a test circuit used to illustrate the performance of the device of FIGURE 4.

Referring now to FIGURE 4 for another embodiment, a semiconductor device is indicated generally by the numeral 22 and has a layer of N type 23 material and a layer of P type material 24. The layers 23 and 24 may be of silicon and form a PN junction 25. Ohmic contacts 26 and 27 are provided across the ends of the layers 23 and 24 and for purposes of illustration are designated as emitter and base respectively. An ohmic contact 28 is provided on the layer 23 or 24 and is designated as the collector. For purposes of explanation FIGURE 4 shows the ohmic contact on layer 24.

In a specific example, a device was fabricated from silicon having a resistivity of approximately 7 ohms cm. by epitaxially depositing a layer of N type material on a layer of P type material and lapping until each layer is 1 mil thick to form a structure 200 mils long, 50 mils wide and 2 mils thick. The ohmic contacts may be aluminum or other suitable material.

Figure 6:
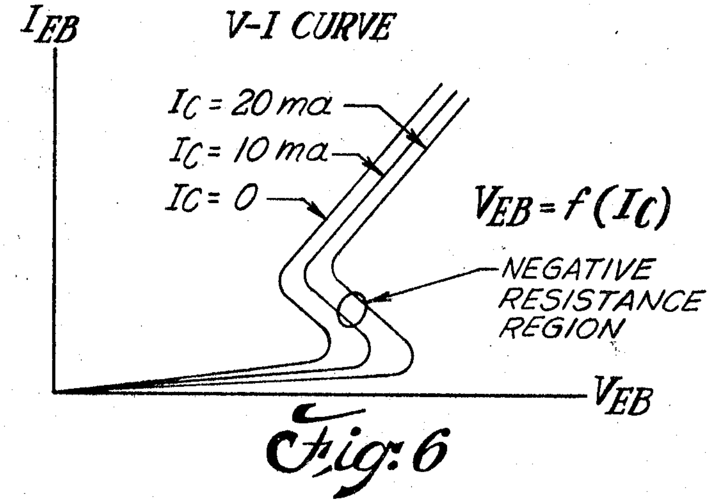
FIGURE 6 is a curve to explain the device of FIGURE 4.
Figures 7A, 7B:
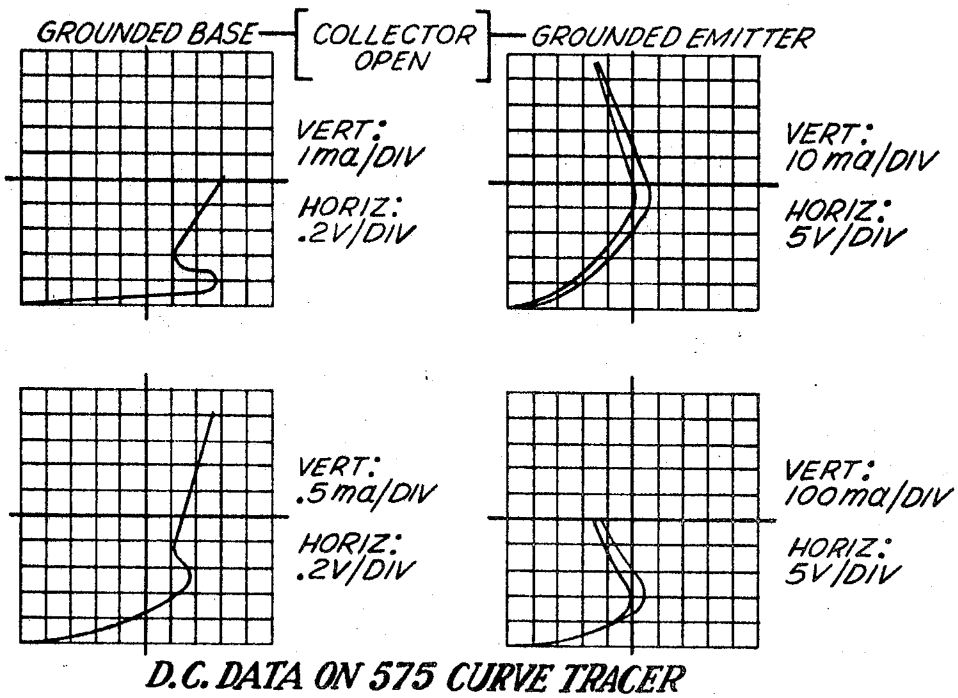
Figures 8A, 8B:
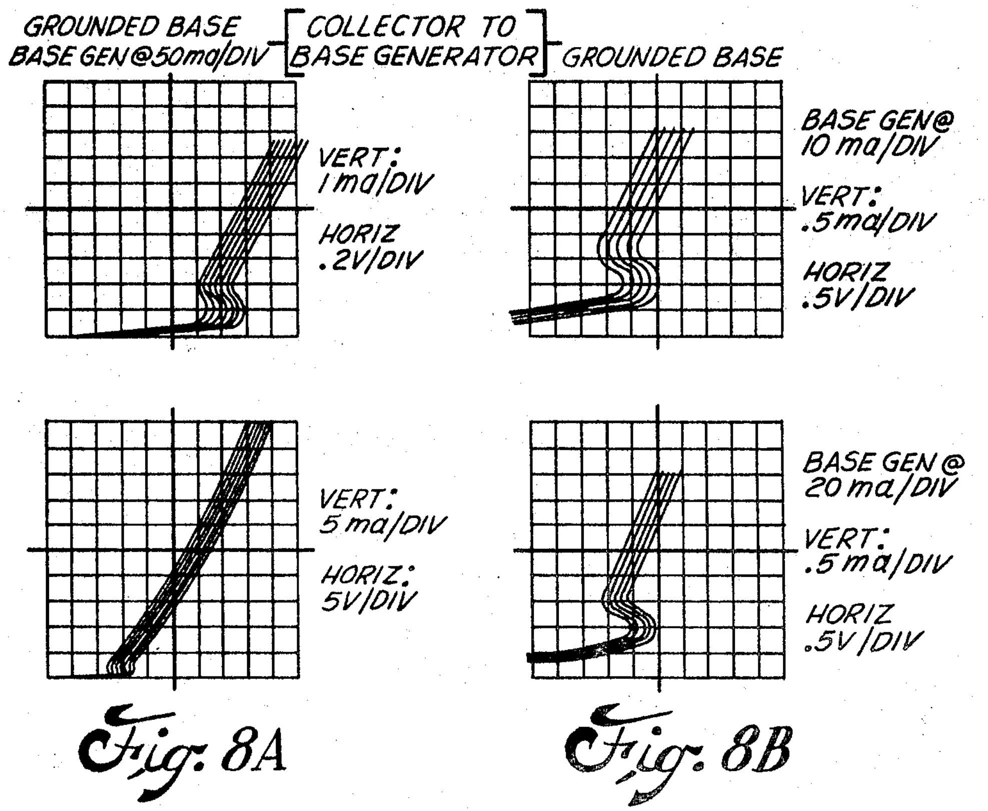

The device 22 was connected to a type 575 curve tracer 17 (see FIGURE 5) by connecting the ohmic contact 26 to the C terminal on the curve tracer by conductor 29. The contact 27 was connected to ground by conductor 30 and the contact 28 connected by conductor 31 to the B terminal on the 575 curve tracer 17. The E terminal of the curve tracer is connected to ground by conductor 32. From data taken (see FIGURES 8A and 8B) it shows that the output voltage is a function of the input current. Using different values of input current (see FIGURE 6) would shift the negative resistance region of the device. Thus by adjusting the input current, control can be achieved of the quiescent point to optimize the device characteristics.

Although only two embodiments of the invention have been illustrated and described, various changes in the form and relative arrangement of the parts, which will now appear to those skilled in the art, may be made without departing from the scope of the invention.

What is claimed:

1. A semiconductor device comprising a first layer of one type of conductivity of semiconductor material, a second layer of a different type of conductivity of semiconductor material, a rectifying junction formed between said layers of semiconductor material, ohmic contacts across the ends of said layers extending across said rectifying junction, and means for exciting said devise to raise the electrons of the bonding atoms of said device to the conduction band.

2. The combination as set forth in claim 1 in which one of said layers is N type silicon and the other of said layers is P type silicon.

3. The combination as set forth in claim 1 in which each layer is 1 mil thick, 200 mils long and 50 mils wide.

4. The combination as set forth in claim 1 in which the material is silicon and has a resistance of approximately 7 ohms cm.

5. The combination as set forth in claim 1 in which said excitation causes said device to have negative resistance characteristics.

6. The combination as set forth in claim 1 and including biasing means for controlling the negative resistance region.

References Cited

UNITED STATES PATENTS 3,158,746 11/1964 Lehovec ------------ 250—199
3,283,221 11/1966 Heiman ------------ 317—235

JAMES D. KALLAM, Primary Examiner

R. F. POLISSACK, Assistant Examiner

U.S. Cl. X.R.

307—324; 317—234, 235